(12) United States Patent
Altazin et al.

(10) Patent No.: US 12,278,315 B2
(45) Date of Patent: Apr. 15, 2025

(54) METHOD FOR MANUFACTURING A COLOUR CONVERSION OPTOELECTRONIC DEVICE, INCLUDING A STEP OF OPTICALLY FORMING SURFACE POTENTIAL PATTERNS IN AN ELECTRET LAYER

(71) Applicant: COMMISSARIAT A L'ENERGIE ATOMIQUE ET AUX ENERGIES ALTERNATIVES, Paris (FR)

(72) Inventors: Stephane Altazin, Grenoble (FR); Etienne Quesnel, Grenoble (FR); Aurelien Suhm, Grenoble (FR); Jeremy Bilde, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/799,155

(22) Filed: Aug. 9, 2024

(65) Prior Publication Data
US 2025/0056934 A1    Feb. 13, 2025

(51) Int. Cl.
*H01L 33/50*    (2010.01)
*H01L 27/15*    (2006.01)

(52) U.S. Cl.
CPC .......... *H01L 33/502* (2013.01); *H01L 27/156* (2013.01); *H01L 33/505* (2013.01); *H01L 33/508* (2013.01)

(58) Field of Classification Search
CPC ... H01L 33/502; H01L 33/505; H01L 33/508; H01L 27/156
See application file for complete search history.

(56) References Cited

U.S. PATENT DOCUMENTS

| 3,276,031 | A | 9/1966 | Gaynor | |
| 2011/0186437 | A1* | 8/2011 | Huang | C25D 7/00 205/95 |
| 2014/0367721 | A1* | 12/2014 | Mahler | F21K 2/00 977/773 |
| 2021/0184100 | A1* | 6/2021 | Matsushita | H01G 7/025 |
| 2022/0282152 | A1* | 9/2022 | D'Amico | H05B 33/145 |

FOREIGN PATENT DOCUMENTS

| WO | WO 2015/186074 A2 | 12/2015 |
| WO | WO 2021/076724 A1 | 4/2021 |

OTHER PUBLICATIONS

Preliminary Search Report & Written Opinion issued Apr. 4, 2024, in corresponding French Patent Application No. 2308637 (with English Translation) 11 pages.

* cited by examiner

*Primary Examiner* — Mark W Tornow
(74) *Attorney, Agent, or Firm* — Oblon, McClelland, Maier & Neustadt, L.L.P.

(57) ABSTRACT

A method for manufacturing an optoelectronic device including an array of diodes and photoluminescent pads arranged opposite at least one diode, including making an electret layer over the array of diodes, by localized polarization or depolarization, optically, so as to form surface potential patterns; and making the photoluminescent pads, by contact of the electret layer with a colloidal solution containing photoluminescent particles, which are then deposited over the upper face of the electret layer opposite the predefined surface potential patterns, thereby forming the photoluminescent pads.

11 Claims, 7 Drawing Sheets

METHOD FOR MANUFACTURING A COLOUR CONVERSION OPTOELECTRONIC DEVICE, INCLUDING A STEP OF OPTICALLY FORMING SURFACE POTENTIAL PATTERNS IN AN ELECTRET LAYER

TECHNICAL FIELD

The field of the invention is that of methods for manufacturing optoelectronic devices including an array of diodes for emitting or detecting an electroluminescent radiation, associated with a colour conversion structure with photoluminescent pads. The invention finds application in particular in display screens and image projectors.

PRIOR ART

There are optoelectronic devices including an array of identical light-emitting diodes covered at least partially with photoluminescent pads ensuring a colour conversion. Such optoelectronic devices may form display screens or image projection systems including an array of luminous pixels of different colours.

In such an optoelectronic device, each luminous pixel including one or more light-emitting diode(s) associated with a photoluminescent pad. In order to obtain luminous pixels adapted to emit light radiations of different colours, for example blue, green or red, all light-emitting diodes may be adapted to emit the same light, for example blue, and the green and red pixels include photoluminescent pads adapted to absorb at least partially the incident blue light emitted by the light-emitting diodes, and to emit in response a green light or a red light.

Hence, the light-emitting diodes are preferably identical to one another, and emit a light radiation with substantially the same wavelength. They may be formed based on a semiconductor material comprising elements of column III and column V of the periodic table, such as an III-V compound, in particular gallium nitride (GaN), indium gallium nitride (InGaN) or aluminium gallium nitride (AlGaN). They are arranged so as to form an array of light-emitting diodes having a front face throughout which the generated light radiation is transmitted. These may consist of organic light-emitting diodes.

The photoluminescent pads may be formed of a binding matrix including particles of a photoluminescent materials such as yttrium aluminium garnet (YAG, standing for Yttrium Aluminium Garnet, in English) activated by the cerium ion YAG:Ce. The photoluminescent particles may also be quantum dots (quantum dots, in English), i.e. in the form of semiconductor nanocrystals in which the quantum confinement is substantially three-dimensional. In particular, these may consist of InP, perovskite or CdSe crystals.

The manufacturing method may include depositing and then structuring a photoluminescent layer to form first photoluminescent pads, for example adapted to convert blue into green. These steps are performed again to form second photoluminescent pads, for example adapted to convert blue into red. However, this method has the drawback of being barely suited to arrays of diodes with a small pixel pitch, for example in the range of 5 µm, to the extent that there might be problems of alignment or coverage of the photoluminescent pads with one another.

The document WO2014/136023 describes another manufacturing method, which uses an electret layer covering the diode array. The method firstly comprises a step of imparting patterns of electric charges on the upper face of a dielectric layer to obtain the electret layer. For this purpose, a polarised AFM tip is used to locally inject the electric charges. Then, a step of localised deposition of colloidal nanocrystals on the patterns of electric charges is performed. For this purpose, the electret layer is contacted with a colloidal solution containing the nanocrystals, which are naturally deposited over the patterns of electric charges under the effect of a dielectrophoretic force. However, this method has in particular the drawback of having to sequentially inject the electric charges, by moving the AFM tip over the surface of the upper face to form the patterns of electric charges therein.

The document WO2021/023656 describes a similar method, where the patterns of electric charges are defined by a stamping technique, i.e. by contacting, with a dielectric layer intended to form the electret layer, an electrically polarised buffer. The lower face of the buffer is structured to form polarised teeth, which come into contact with the dielectric layer. Thus, the electret layer wherein the upper face has the patterns of electric charges is obtained. Afterwards, the electret layer is contacted with a colloidal solution, the nanocrystals present then being deposited over the patterns of electric charges by dielectrophoresis. However, this method particularly has the drawback of having to position the buffer accurately with respect to the diode array. Yet, the positioning uncertainty of the buffer with respect to the diode array may become problematic, in particular for diode arrays with a small pixel pitch, for example in the range of 5 µm. Indeed, this positioning uncertainty could lead to an improper positioning of the photoluminescent pads with respect to the diodes, and therefore to a degradation of the performances of the optoelectronic device.

DISCLOSURE OF THE INVENTION

An objective of the invention is to overcome at least part of the drawbacks of the prior art, and more particularly to provide a method for manufacturing an optoelectronic device, where the formation of the patterns of electric charges, which will herein be called surface potential patterns, is performed in an electret layer through an optical process, either by a localised polarisation of the electret layer, or by a localised depolarisation of the electret layer. This step allows simultaneously making all of the surface potential patterns in the electret layer, without the need to use an AFM tip or a buffer as described before, and therefore making photoluminescent pads which have a proper positioning with respect to the array of diodes.

For this purpose, an object of the invention is a method for manufacturing an optoelectronic device including: an array of diodes, adapted to emit or receive a light radiation; and a colour conversion structure, covering at least partially the array of diodes, and containing photoluminescent pads arranged opposite at least one diode.

The manufacturing method includes the following steps:
A/ providing the array of diodes;
B/ making an electret layer, covering the array of diodes, and an upper face of which, opposite to the array of diodes, has predefined surface potential patterns where the surface potential is non-zero;
C/ making the photoluminescent pads, by contact of the electret layer with a colloidal solution containing photoluminescent particles, which are then deposited over the upper face of the electret layer opposite the predefined surface potential patterns, thereby forming the photoluminescent pads.

According to the invention, step B of making the electret layer includes the following steps:

B1/ making an electret layer whose upper face has, over its entire face, a non-zero or zero initial surface potential; then B2a/ in the case where the initial surface potential is non-zero: illuminate areas of the electret layer with a so-called depolarisation light radiation able to be absorbed at least partially by the electret layer, said illuminated areas being distinct from non-illuminated areas intended to form the surface potential patterns, the absorption of the depolarisation light radiation in the illuminated areas causing a cancellation of the local surface potential, the non-illuminated areas then defining the surface potential patterns;

B2b/ or, in the case where the initial surface potential is zero: illuminate areas of the electret layer by a so-called polarisation light radiation able to be absorbed at least partially by the electret layer, the absorption of the polarisation light radiation in the illuminated areas causing a formation of a non-zero local surface potential, the illuminated areas then defining the surface potential patterns.

Some preferred yet non-limiting aspects of this method are as follows.

The method may include, prior to step B2a or B2b, a step of arranging an opaque mask, made of a material opaque to the depolarisation or polarisation light radiation, extending only over the areas of the electret layer intended to form the surface potential patterns; then, during step B2a or B2b, the depolarisation or polarisation light radiation may be emitted in the direction of the opaque mask and the electret layer, and is absorbed by the electret layer in the areas not covered by the opaque mask.

The diodes may consist of light-emitting diodes. The electret layer may be made of a material adapted to partially absorb the light radiation emitted by the light-emitting diodes, which causes a cancellation of the local surface potential. During step B2a, some diodes may be selectively activated so as to illuminate the electret layer in the areas intended not to form the surface potential patterns, which causes a cancellation of the local surface potential, the non-illuminated areas then defining the surface potential patterns. Or, during step B2b, diodes may be selectively activated so as to illuminate the electret layer only in the areas intended to form the surface potential patterns.

In connection with step B2a, the electret layer may be made of a self-polarised organic dielectric material, so that step B1 may then consist in depositing the electret layer covering the array of diodes, the electret layer then having, over its entire surface, a non-zero initial surface potential.

In connection with step B2b, the electret layer is made of a photochromic dielectric material, so that step B1 may then consist in depositing an electret layer, made of the photochromic dielectric material, covering the array of diodes, the electret layer then having, over its entire surface, a zero surface potential.

In connection with step B2a, the electret layer may be made of a dielectric material, so that step B1 includes the following steps: depositing an electret later, made of the dielectric material, covering the array of diodes, the electret layer then having, over its entire surface, a zero initial surface potential; then subjecting the electret layer to a predefined electric field, so-called polarisation field, causing a formation of a non-zero surface potential over the entire surface of the electret layer.

The array of diodes may include an upper electrode layer covering the diodes and adapted to electrically polarise the diodes. During the step of subjecting the electret layer to the polarisation electric field, the electret layer may then be arranged between the upper electrode layer and an added-on electrode, between which a predefined potential difference is applied.

The electret layer made during step B may be a first electret layer. The photoluminescent pads made during step C may then consist of first photoluminescent pads adapted to convert an incident light radiation with a first wavelength into a light radiation with a second wavelength different from the first wavelength.

The method may then include the following steps, following step C:

D/ making a second electret layer, covering the array of diodes and the first electret layer, and an upper face of which, opposite to the array of diodes, has second predefined surface potential patterns where the surface potential is non-zero, said second surface potential patterns being located opposite diodes distinct from those opposite which the first surface potential patterns are located;

E/ making the second photoluminescent pads, by contact of the second electret layer with a colloidal solution containing second photoluminescent particles, different from the first photoluminescent particles of step C, which are then deposited over the upper face of the second electret layer opposite the second predefined surface potential patterns, thereby forming the second photoluminescent pads.

The diodes of the array may consist of light-emitting diodes adapted to emit a light radiation at the same wavelength. They may then form, with the first and second photoluminescent pads, an array of red, green, blue luminous pixels.

The array of diodes may have a dimension, in a plane parallel to the array of diodes, larger than or equal to 100 mm.

The array of diodes may have a pitch with a periodicity smaller than or equal to 10 µm, or 5 µm, or 2 µm.

BRIEF DESCRIPTION OF THE DRAWINGS

Other aspects, aims, advantages and features of the invention will become more apparent upon reading the following detailed description of preferred embodiments thereof, given as a non-limiting example, and made with reference to the appended drawings, wherein.

DETAILED DISCLOSURE OF PARTICULAR EMBODIMENTS

In the figures and in the remainder of the description, the same references represent identical or similar elements. In addition, the various elements are not shown to scale so as to promote clarity of the figures. Moreover, the different embodiments and variants are not mutually exclusive and can be combined together. Unless indicated otherwise, the terms "substantially", "about", "in the range of" mean within a 10% margin, and preferably within a 5% margin. Moreover, the terms "comprised between . . . and . . . " and the like mean that the bounds are included, unless stated otherwise.

The invention relates to a method for manufacturing an optoelectronic device including an array of diodes covered with a colour conversion structure with photoluminescent pads. Making of the photoluminescent pads is obtained by deposition of photoluminescent particles over surface potential patterns of an upper face of an electret layer. As detailed later on, the surface potential patterns are defined by locally depolarising, or by locally polarising, the electret layer through an optical process. Moreover, the diodes may consist of emissive diodes (for example light-emitting diodes) or photodiodes.

In general, an electret layer is a dielectric layer containing fixed electric charges or an almost-permanent dipolar polarisation. Also, the electret layer has a non-zero surface potential over its upper face. This is reflected by the fact that the electret layer generates an outer electric field in the absence of an applied field. By extension, we will also call "electret layer' a dielectric layer initially having a zero surface potential over its entire surface, and which is intended to form an electret layer having surface potential patterns.

In the context of the invention, we take advantage of the fact that an electret layer could be depolarised by absorption of a so-called depolarisation light radiation, as explained in the article by Sugi et al. entitled *Characterisation of light-erasable giant surface potential built up in evaporated $Alq_3$ thin films*, Thin Solid Films 464-465 (2004), 412-415, and the article by Tanaka et al. entitled *Self-Assembled Electret for Vibration-Based Power Generator*, Sci Rep 10, 6648 (2020). Such a depolarisation then results in a cancellation of the surface potential of the electret layer. Indeed, the absorption of the depolarisation light radiation results in the creation of electron-hole pairs which, according to one approach, compensate for the charge polarisation, which results in a cancellation of the surface potential. Moreover, an electret layer may also be polarised by the absorption of a so-called polarisation light radiation.

Thus, as detailed later on, according to one embodiment, an electret layer is made at first, which initially has a non-zero surface potential over its entire surface. Then, predefined areas of the electret layer are polarised, by illuminating them by a depolarisation light radiation which could be absorbed at least partially by the electret layer. The illuminated areas then a zero surface potential, while the non-illuminated areas keep their surface potential non-zero, and thus form the surface potential patterns where the photoluminescent particles will be deposited in a localised manner afterwards, during the next step, by dielectrophoresis. Also, the photoluminescent pads are naturally located opposite (i.e. "perpendicular to") the surface potential patterns, and not outside these predefined patterns. This method then allows accurately defining the surface potential patterns over the upper face of the electret layer, even though the array of diodes has a large dimension (in particular when it is made using a 100 mm or 200 mm wafer technology) and/or the pixel pitch of the array of diodes is small (for example in the range of 5 µm or less, for example 2 µm).

Moreover, according to another embodiment, an electret layer is made at first which initially has a zero surface potential over its entire surface. Then, predefined areas of the electret layer are polarised by illuminating them with a polarisation light radiation which could be absorbed at least partially by the electret layer. The illuminated areas then have a non-zero surface potential (while the non-illuminated areas keep their surface potential zero), and thus form the surface potential patterns where the photoluminescent particles will be deposited in a localised manner afterwards, during the next step, by dielectrophoresis. Like before, this method allows accurately defining the surface potential patterns over the upper face of the electret layer.

Moreover, the photoluminescent pads are adapted to convert at least partially an incident light radiation with a first wavelength $\lambda_1$ into a luminescence light radiation with a longer wavelength $\lambda_2$. For illustration, they may be adapted to absorb blue light, i.e. whose wavelength is comprised between about 440 nm and 490 nm, and to emit in the green band, i.e. at a wavelength comprised between about 495 nm and 560 nm, and possibly in the red band, i.e. at a wavelength comprised between 600 nm and 650 nm, or in the infrared band. By wavelength, it should herein be understood the wavelength for which the emission spectrum has an intensity peak. For merely illustrative purposes, the light-emitting diodes may have an emission spectrum whose intensity peak is comprised between 380 nm and 490 nm. In the case of an array of light-emitting diodes, the incident light radiation is the radiation emitted by the diodes, while in the case of photodiodes, it consists of the light radiation originating from an external environment and directed towards the photodiodes. It should be noted that, in the case of photodiodes, the photoluminescent pads allow filtering a portion of the spectral range of the incident light radiation, for example in order to proceed with a spectral analysis.

The photoluminescent pads are formed of particles made of at least one photoluminescent material, and preferably particles a maximum dimension of which is comprised between 0.2 nm and 1000 nm, for example comprised between 0.2 nm and 100 nm, and for example between 1 nm and 30 nm. The size and/or the composition of the photoluminescent particles are selected according to the desired luminescence wavelength. The particles may have any shape, for example spherical, angular, flattened, elongate, etc.

The photoluminescent particles may consist of quantum dots (quantum dots, in English), i.e. semiconductor nanocrystals the quantum confinement of which is substantially three-dimensional, or aggregates of quantum dots. The average size of the quantum dots may then be comprised between 0.2 nm and 50 nm, for example between 1 nm and 30 nm. They may also consist of nanoplatelets (nanoplatelets, in English), i.e. nanoparticles having an essentially two-dimensional shape. Also, the smallest dimension (thickness) is smaller than the two other length and width dimensions, preferably by a ratio of at least 1.5.

In particular, the photoluminescent particles may be formed of at least one semiconductor compound, which may be selected, for example, from among cadmium selenide (CdSe), indium phosphide (InP), indium gallium phosphide (InGaP), cadmium sulphide (CdS), zinc sulphide (ZnS), cadmium oxide (CdO) or zinc oxide (ZnO), cadmium zinc selenide (CdZnSe), zinc selenide (ZnSe) doped for example with copper or manganese, graphene or from among other potentially suitable semiconductor materials. The nanoparticles may also have a core/shell type structure, such as CdSe/ZnS, CdSe/CdS, CdSe/CdS/ZnS, PbSe/PbS, CdTe/CdSe, CdSe/ZnTe, InP/ZnS or other.

FIGS. 1A to 1H illustrate different steps of a method for manufacturing an optoelectronic device 1 according to one embodiment. In this example, at least one amongst the electret layers E1, E2, and herein both electret layers, is/are made of a self-polarised dielectric material. In this example, the surface potential patterns are made optically by localised depolarisation of an electret layer having initially, over its entire surface, a non-zero surface potential.

Moreover, the optoelectronic device 1 includes an array of RGB (red, green, blue) type luminous pixels. Each RGB pixel is herein formed of several R, G or B type light sub-pixels, each including at least one light-emitting diode (one diode per sub-pixel). In the description, a sub-pixel associated with a given colour is so-called "pixel". Alternatively, the optoelectronic device 1 could include an array of photodiodes.

An orthogonal three-dimensional direct reference frame XYZ is defined herein and for the following description, where the axes X and Y form a main plane in which a support substrate 11 extends, and where the Z axis is directed according to the thickness of the array of diodes 10 in the direction of the front face. The terms 'lower' and 'upper' are defined with respect to an increasing positioning according to the direction+Z.

Figure 1A:
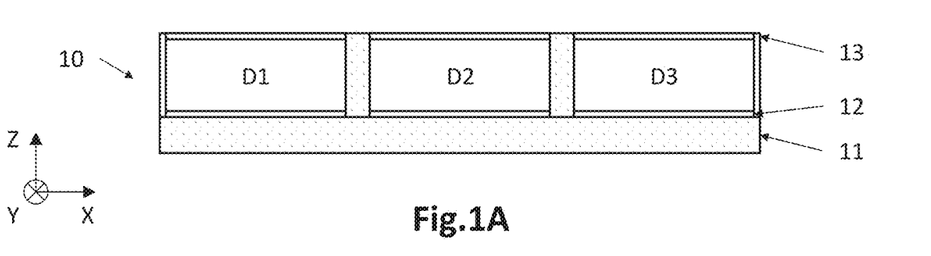
FIGS. 1A to 1H illustrate different steps of a method for manufacturing an optoelectronic device, where at least one of the electret layers is made of a self-polarised dielectric material.

Referring to FIG. 1A, an array of light-emitting diodes 10 is provided. In this example, the diodes are distributed into three types denoted D1, D2, D3, depending on whether they are intended to form pixels P1, P2, P3 of different colours. The diodes herein rest on a support substrate 11, and are herein electrically polarised by a lower electrode layer 12 and by an upper electrode layer 13. Other configurations are possible, in particular in the case where the support substrate 11 is electrically-conductive.

The diodes D1, D2, D3 are herein made in a conventional manner, for example by epitaxy of semiconductor layers. Each diode D1, D2, D3 is formed of a stack of a lower semiconductor portion doped with a first conductivity type, for example p type, of an active area where the light radiation of the light-emitting diode is emitted, and of an upper semiconductor portion doped with a second conductivity type, for example n type. The diodes D1, D2, D3 may be made from the same semiconductor compound, for example based on an III-V compound such as GaN, InGaN, AlGaN, inter alia.

Preferably, the diodes D1, D2, D3 are structurally identical, so that the emitted light radiation is substantially identical from one diode to another in terms of wavelength. In this example, the diodes D1, D2, D3 are adapted to emit a light radiation in the blue band, i.e. whose emission spectrum has an intensity peak at a wavelength comprised between about 440 nm and 490 nm.

A front face of the array of diodes 10 is a substantially planar face, whereby the possible presence of surface microstructures allow improving light extraction. It is herein formed of the upper face of the upper electrode layer 13 adapted to electrically polarise the diodes. It may also be formed by a passivation thin layer (not shown) which covers the diodes and the upper electrode layer.

Figure 1B:
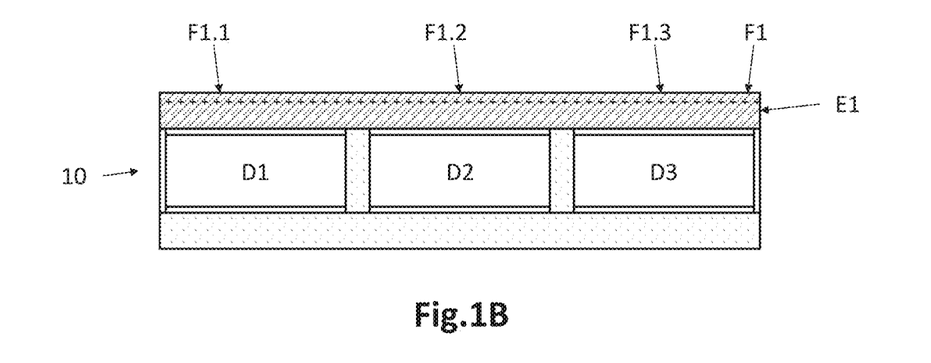
Figure 1C:
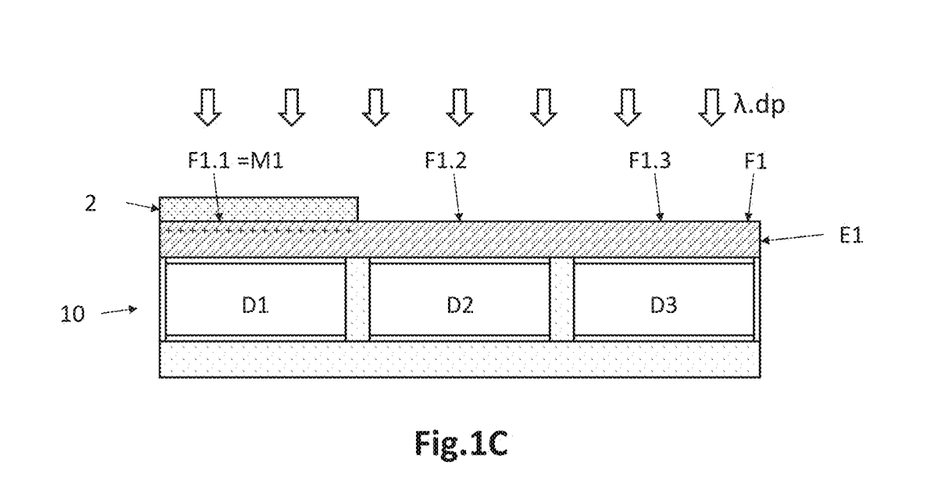

Referring to FIGS. 1B and 1C, a first electret layer E1 is made afterwards, which covers at least partially the array of diodes 10, and whose upper face F1 has first surface potential patterns M1 where the surface potential is non-zero. These patterns M1 are surrounded, at least partially, by areas of the upper face F1 where the surface potential is zero. As indicated before, an electret layer has a non-zero surface potential at its upper face because of the presence of electric charges or of a dipolar polarisation (vertical orientation of the dipoles). In this case, the surface potential of the upper face F1 is non-zero only in predefined patterns M1, so-called surface potential patterns, while it is substantially zero outside these patterns M1. It may have a value of about 10V. Hence, the electrical potential patterns M1 are the surfaces of the upper face where the electrical potential is non-zero. They extend opposite at least one diode, and are intended to form the surfaces where photoluminescent particles will be deposited during making of the photoluminescent pads.

Referring to FIG. 1B, an electret layer E1 is deposited which covers at least partially the array of diodes 10. In this example, the electret layer E1 is made of a self-polarised dielectric material, i.e. it has not been necessary to polarise the dielectric layer in a dedicated step. Hence, it forms an electret layer whose upper face F1 has, over its entire surface, a non-zero initial surface potential. By "over its entire surface", it should be understood at least over the entire surface of the upper face of the electret layer which is opposite the array of diodes. In this example, the electret layer E1 covers all of the diodes D1, D2 and D3 but could cover only part of the diodes, for example only those intended to form the red pixels and the green pixels. Its upper face has several areas F1.1, F1.2 and F1.3, located respectively opposite the diodes D1, D2 and D3.

Moreover, the material of the electret layer E1 is selected so as to be at least partially absorbent at the wavelength of a depolarisation light radiation (for example in the ultraviolet band), and at least partially transparent at the wavelength of the light radiation emitted by the diodes (for example in the blue band). By "at least partially absorbent", it should be understood that the absorption rate is at least 20% (or less, for example at least 10%), of at least 50%, at the wavelength of the depolarisation light radiation. And by "at least partially transparent", it should be understood that the transmission rate is at least 50% at the wavelength of the light radiation emitted by the diodes. The electret layer may have a thickness of a few tens to hundred nanometres, and preferably at most equal to 2 μm.

For example, the self-polarized dielectric material may be an organic material selected from among BCPO (bis-4-(N-carbazolyl)phenyl)phenylphosphine oxide), DPEPO (bis[2-(diphenylphosphino)phenyl]ether oxide), mCBP-CN (3,3'-di(carbazol-9-yl)-5-cyano-1,1'-biphenyl) and PO9(3,6-bis (diphenylphosphoryl)-9-phenylcarbazole).

It may also be an organic material selected from among: TPBi (2,2',2"-(1,3,5-Benzinetriyl)-tris(1-phenyl-1-H-benzimidazole)), o-ethyl-TPB, m-ethyl-TPBi, p-ethyl-TPBi, Alq3 (tris(8-hydroxyquinolinato)aluminum), Al(7-Prq)3 (tris(7-propyl-8-hydroxyquinolinato)aluminium (III)), Al(q-Cl)3 (tris(5-chloro-8-hydroxyquinolinato)aluminum), OXD-7 (2,2'-(1,3-phenylene)-bis[5-(4-tert-butylphenyl)-1, 3,4-oxadiazole]), BCP (2,9-dimethyl-4,7-diphenyl-1,10-phenanthroline), Gaq3 (tris(8-hydroxyquinoline) gallium), Balq (bis(2-methyl-8-quinolinate) 4-phenylphenolate), Ir(ppy)3 (tris(2-phenylpyridine)iridium (III)), Ir(ppy)2acac (bis(2-phenylpyridine)iridium (III) acetylacetonate), Ir(ppy) 2tmd (bis(2-phenylpyridine)iridium (III) (2,2,6,6-tetramethylheptane-3,5-diketonate)), Bpy-OXD(1,3-Bis[2-(2,2'-bipyridine-6-yl)-1,3,4-oxadiazo-5-yl]benzene), 2CzPN (4,5-di (9H-carbazol-9-yl) phthalonitrile), 1,2,3,5-tetrakis(carbazol-9-yl)-4,6-dicyanobenzene, 4CzPN (3,4,5,6-tetrakis (carbazol-9-yl)-1,2-dicyanobenzene), DCJTB (4-(dicyanomethylene)-2-t-butyl-6-(1,1,7,7-tetramethyljulolidyl-9-enyl)-4H-pyran), DACT-II (9-[4-(4, 6-diphenyl-1,3,5-triazin-2-yl)phenyl]-N,N,N',N'-tetraphenyl-9H-carbazole-3,6-diamine), mCP (1,3-Bis(N-carbazolyl)benzene), α-NPD (N,N'-bis(1-naphthyl)-N,N'-diphenyl-1,1'-biphenyl-4,4'-diamine), Znq2 (bis(8-hydroxyquinoline) zinc), and B3PyMPM (bis-4,6-(3,5-di-3-pyridylphenyl)-2-methylpyrimidine).

Referring to FIG. 1C, the electret layer E1 is locally depolarised, optically, so as to define the first surface potential patterns M1. For this purpose, an opaque layer is herein deposited over the electret layer E1, which is structured afterwards by photolithography and etching to obtain an opaque mask 2 which herein extends only opposite the diodes D1, i.e. only over the areas F1.1. Hence, it does not extend opposite the diodes D2 and D3. The opaque mask 2 may be made of a photosensitive resin opaque to the depolarisation light radiation, herein to ultraviolet. Alternatively, the opaque mask 2 may be the photolithography mask at the level of the stepper.

Afterwards, the electret layer E1 is subjected to the depolarisation light radiation, with a wavelength λ.dp, which is then absorbed by the electret layer E1 only in the areas F1.2 and F1.3 (not covered by the opaque mask 2), and not in the areas F1.1. Also, the absorption of the depolarisation light radiation causes a localised depolarisation in the areas F1.2 and F1.3 of the upper face F1 of the electret layer E1. Hence, the areas F1.1 of the upper face F1 of the electret layer E1 for the surface potential patterns M1. For example, the depolarisation light radiation may be in the ultraviolet band, i.e. with a main wavelength comprised between 100 and 380 nm. After this step, the resin 2 is herein removed.

Figure 1D:
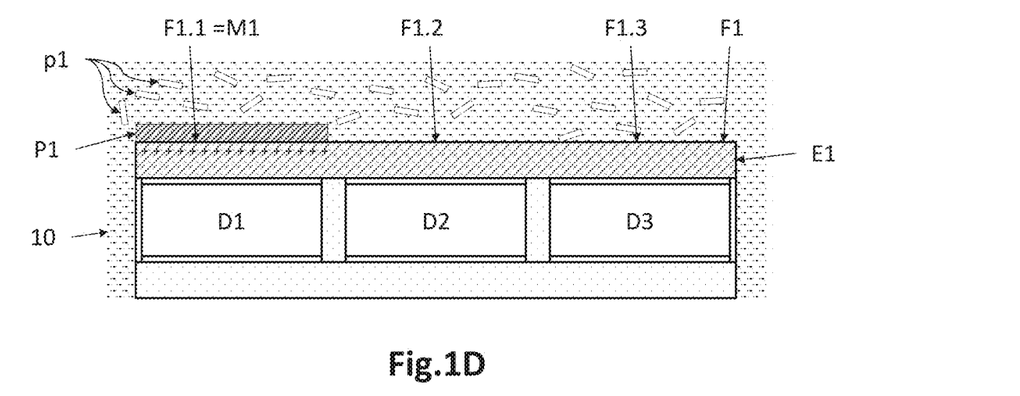

Referring to FIG. 1D, the first photoluminescent pads P1 are made afterwards, by localised deposition of first photoluminescent particles p1 over the electret layer E1 opposite the first surface potential patterns M1. For this purpose, a procedure similar to that one described in the documents WO2014/136023 and WO2021/023656 is followed. Thus, a colloidal solution containing the first photoluminescent particles p1 is brought into contact with the upper face F1 of the electret layer E1. Thus, it is possible to immerse the entire stack in the colloidal solution, or deposit a drop of such a solution over the electret layer E1. Because of the non-zero surface potential prevailing in the surface potential patterns M1, a non-uniform electric field is generated which causes a localised deposition of the photoluminescent particles p1 by dielectrophoresis. Also, the photoluminescent particles p1 are deposited essentially opposite the first patterns M1, and substantially not outside the patterns M1 (i.e. not opposite the areas F1.2 and F1.3). The duration of contact of the colloidal solution over the electret layer E1 depends in particular on the amount of photoluminescent particles p1 to be deposited, the concentration of particles, their size, the surface potential, etc. For example, the thickness of the photoluminescent pads P1 may be in the range of a few hundred nanometres, for example equal to about 400 nm. Afterwards, the colloidal solution is removed and the electret layer E1 could be dried. It should be noted that the surface potential of the patterns M1 has become substantially zero. Indeed, the photoluminescent particles p1 graft to the surface of the electret layer E1 at the level of the patterns M1, until a substantially complete attenuation of the potential of the patterns M1 is achieved.

Figure 1E:
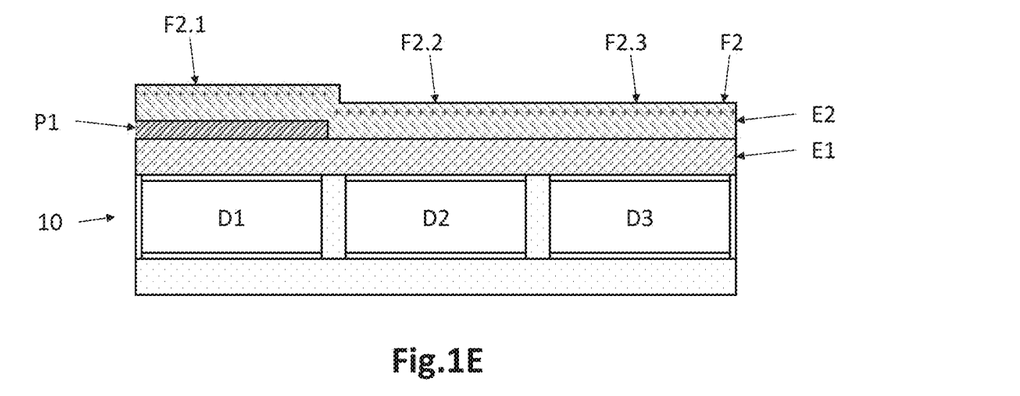
Figure 1F:
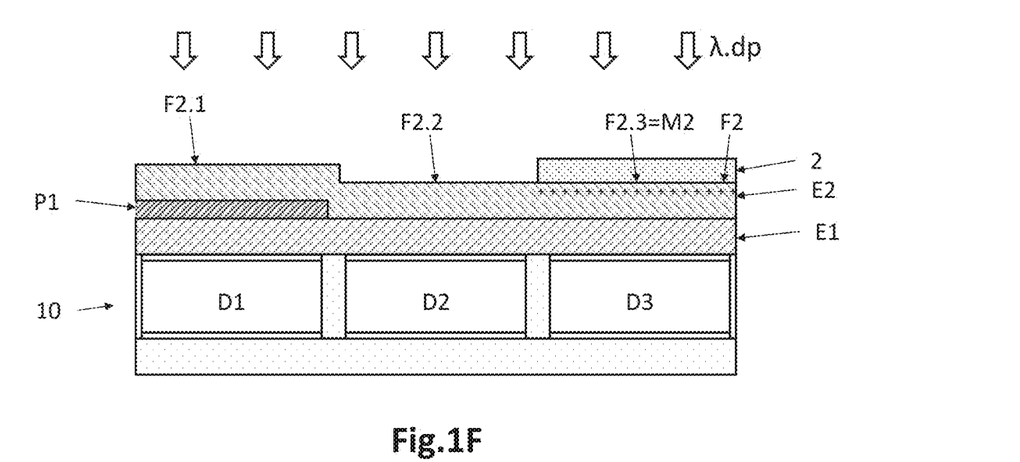

Referring to FIGS. 1E and 1F, a second electret layer E2 is made afterwards which covers at least partially the array of diodes 10, and whose upper face F2 also has second surface potential patterns M2 where the surface potential is non-zero. The second surface potential patterns M2 are not herein located opposite the first photoluminescent pads P1, so that the second photoluminescent pads P2 are opposite diodes different from the diodes D1, in order to form luminous pixels of another colour.

For this purpose, with reference to FIG. 1E, the second electret layer E2, herein also made of a self-polarised dielectric material, is also deposited so as to cover the first electret layer E1 as well as the first photoluminescent pads P1. Hence, its upper face F2 has, over its entire surface, a non-zero surface potential. This second electret layer E2 may be made of a material identical to that one of the first electret layer E1. It is also selected so as to be at least partially absorbent to the wavelength of a depolarisation light radiation (herein in the ultraviolet band), and at least partially transparent to the wavelength of the light radiation emitted by the diodes (herein in the blue band). The electret layer E2 may have a thickness in the range of a few tens to hundred nanometres, and preferably at most equal to 2 μm.

Referring to FIG. 1F, the second electret layer E2 is locally depolarised, optically, so as to define the second surface potential patterns M2 defined in its upper face F2. For this purpose, an opaque layer is deposited over the second electret layer E2, which is structured afterwards by photolithography and etching to obtain an optical mask 2 which herein extends only opposite the diodes D3. Hence, it does not extend opposite the diodes D1 and D2. Alternatively, as indicated before, the mask 2 may be the photolithography mask at the level of the stepper.

Afterwards, the second electret layer E2 is subjected to the depolarisation light radiation, which is then absorbed by the second electret layer E2 only in the areas F2.1 and F2.2 (not covered by the opaque mask 2), and not in the areas F2.3. Also, the absorption of the depolarisation light radiation causes a localised depolarisation in the areas F2.1 and F2.2 of the upper face F2 of the electret layer E2. Hence, the areas F2.3 of the upper face F2 of the electret layer E2 form the second surface potential patterns M2.

Preferably, if the potential of the patterns M1 is not totally zero, a portion of the depolarisation light radiation is transmitted by the second electret layer E2, and then by the photoluminescent pads P1 to be absorbed afterwards by the first electret layer E1, which locally depolarises the first surface potential patterns M1. The risk of the second photoluminescent particles p2 being deposited afterwards opposite the first photoluminescent pads P1 is limited further.

Figure 1G:
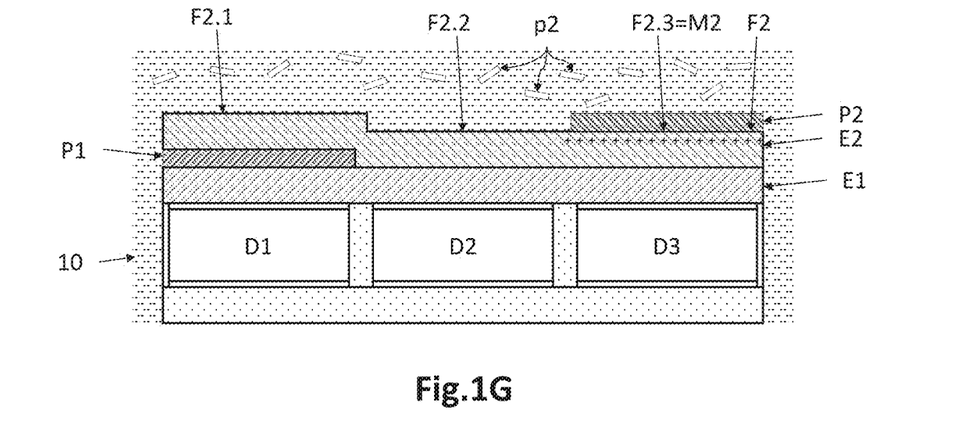

Referring to FIG. 1G, the second photoluminescent pads P2 are made afterwards, by localised deposition of second photoluminescent particles p2 over the electret layer E2 opposite the second surface potential patterns M2. For this purpose, a procedure similar to that one used for the first photoluminescent pads P1 is followed, by bringing a colloidal solution containing the second photoluminescent particles p2 in contact with the upper face F2 of the second electret layer E2. Because of the non-zero surface potential prevailing in the second patterns M2, a non-uniform electric field is generated which causes a localised deposition of the photoluminescent particles p2 by dielectrophoresis. Also, the photoluminescent particles p2 are deposited essentially opposite the second patterns M2, and substantially not outside the patterns M2 (i.e. not opposite the areas F2.1 and F2.2), and the second photoluminescent pads P2 are obtained. It should be noted that the surface potential of the patterns M2 becomes substantially zero, as the photoluminescent particles p2 are grafted. Afterwards, the colloidal solution is removed and the electret layer could be dried.

Figure 1H:
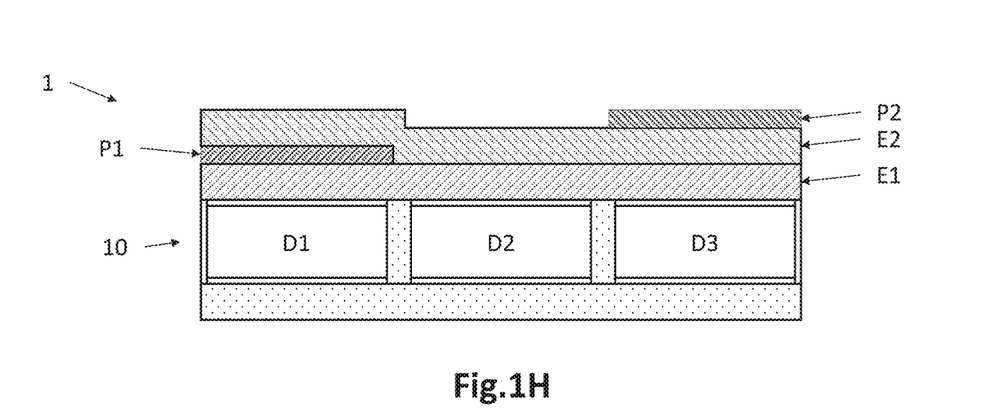

Thus, with reference to FIG. 1H, an optoelectronic device 1 is obtained, which comprises an array of diodes 10 and a colour conversion structure formed by photoluminescent pads P1 and P2. In this example, the diodes D2 form blue pixels, the diodes D1 associated with the photoluminescent pads P1 form, for example, red pixels, and the diodes D3 associated with the photoluminescent pads P2 form green pixels. To form the photoluminescent pads, the method has implemented a step of optical localised depolarisation of electret layers E1 and E2 having an initially non-zero surface potential over the entire surface of the upper face. Hence, we avoid having to resort to a step of localised injection of electric charges in an electret layer initially free of electric charges, like in the examples of the aforementioned prior art. Also, the method is quick and making of the photoluminescent pads is spatially accurate, even in the context of an array of diodes made from a large-size substrate (for example, 100 or 200 mm) and/or whose pixel pitch is very small (for example 5 µm or less).

Figure 2A:
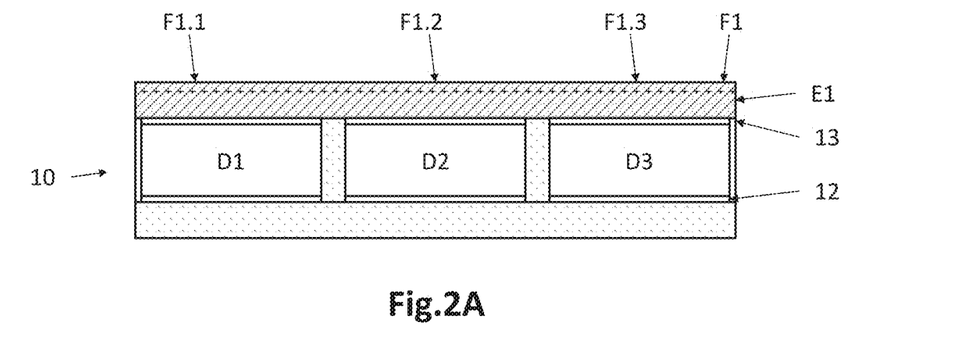
FIGS. 2A to 2C illustrate different steps of a variant of the method for manufacturing an optoelectronic device, where the localised depolarisation is performed by means of diodes, of the array of diodes, selectively activated.
Figure 2B:
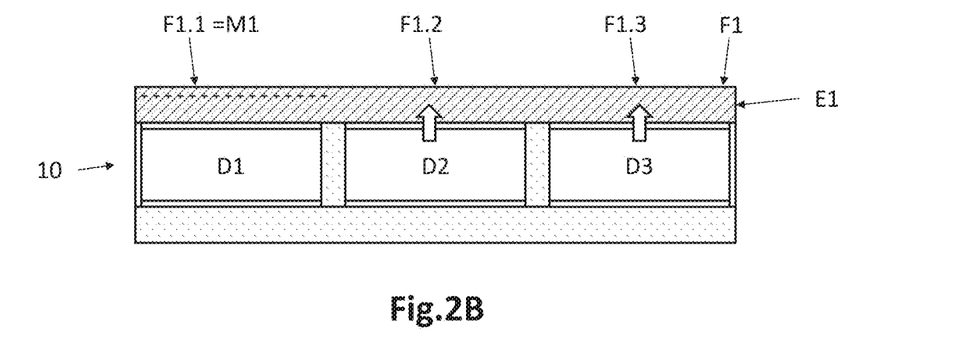
Figure 2C:
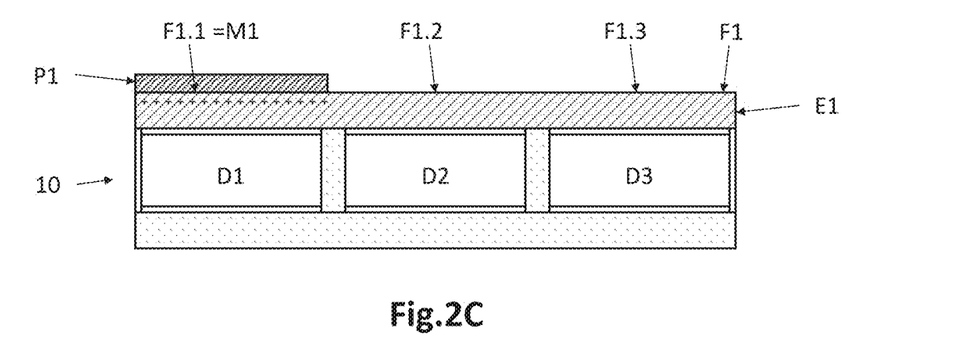

FIGS. 2A to 2C illustrate different steps of a method for manufacturing an optoelectronic device according to one variant. In this example, the surface potential patterns are made optically by localised depolarisation of an electret layer having initially, over its entire surface, a non-zero surface potential.

This method differs from that one of FIGS. 1A-1H essentially in that the depolarisation light radiation corresponds to the light radiation emitted by the diodes. In this case, the array of diodes is adapted to selectively activate the diodes D1, D2 and D3, and includes for this purpose lower 12 and upper 13 electrodes arranged so as to enable this selective activation.

In addition, the material of the electret layer E1 is adapted to absorb only partially the light radiation emitted by the diodes D1, D2, D3, and to transmit the non-absorbed portion. Thus, the absorbed portion allows locally depolarising the electret layer, in the areas of the upper face opposite the activated diodes. The areas of the upper face located opposite the non-activated diodes then keep their non-zero surface potential, and then define the surface potential patterns.

Referring to FIG. 2A, an array of diodes 10 covered with an electret layer E1 is provided. The upper face F1 of the latter has, over its entire surface, a non-zero surface potential. The electret layer E1 is then made of a dielectric material adapted to partially absorb only the light radiation emitted by the diodes, herein in the blue (or near-blue) band.

Referring to FIG. 2B, the diodes are selectively activated, i.e. only some of them are activated. In this case, only the diodes D2 and D3 are activated, and not the diodes D1. The emitted light radiation is then partially absorbed locally by the electret layer E1 in the areas F1.2 and F1.3 of the upper face F1 located opposite the diodes D2 and D3, which is reflected by a local depolarisation of the electret layer E1 opposite these diodes. However, to the extent that the diodes D1 are not activated, the electret layer E1 remains locally polarised in the areas F1.1, which then define the first surface potential patterns M1.

Referring to FIG. 2C, the first photoluminescent pads P1 are made afterwards, in the same manner as before (cf. FIG. 1D), by contact of the electret layer E1 with a colloidal solution containing the photoluminescent particles p1. These are then deposited naturally over the electret layer E1 in the surface potential patterns M1, so that the photoluminescent pads P1 are positioned opposite the diodes D1 and not opposite the diodes D2 and D3.

The manufacturing method may be carried on in the same manner as before (not shown). Thus, a second electret layer E2 is deposited, which herein covers the array of diodes 10 as well as the first pads P1 and the electret layer E1. The upper face of the electret layer E2 has a non-zero surface potential over its entire surface. Afterwards, this second electret layer E2 is locally depolarised, optically, in a manner identical to FIG. 2B. Thus, only the diodes D1 and D2 are activated, so as to depolarise the areas F2.1 and F2.2 of the upper face F2 of the electret layer E2. However, the diodes D3 are not activated, so that the areas F2.3 have a non-zero surface potential, and thus form the second surface potential patterns M2. It should be noted that, alternatively, the optical localised depolarisation of the second electret layer E2 may be performed like in the method of FIGS. 1A-1H, i.e. using a dedicated depolarisation light radiation, distinct from that one emitted by the diodes.

Thus, in this variant, the manufacturing method takes advantage of the selective activation of the diodes of the array 10 to locally depolarise the electret layer(s) E1, E2, and thus define the surface potential patterns. In particular, this allows simplifying the making process, and in particular the depolarisation steps.

Figure 3A:
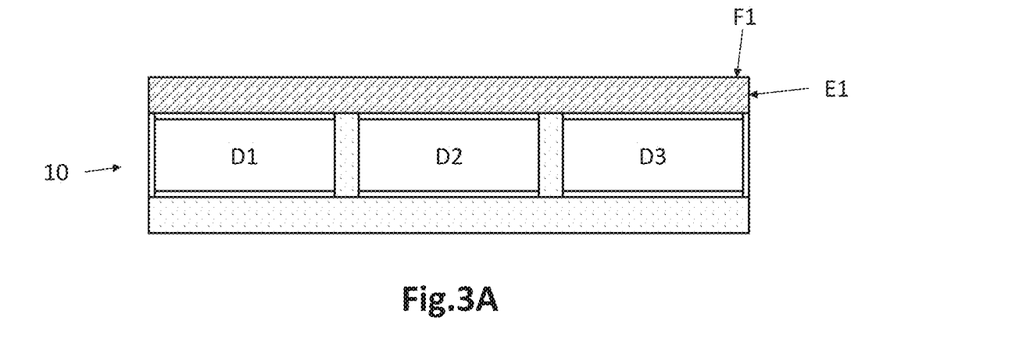
FIGS. 3A to 3C illustrate different steps of a variant of the method for manufacturing an optoelectronic device, where the electret layer is made of a photochromic dielectric material which is electrically polarised locally through an optical process.
Figure 3B:
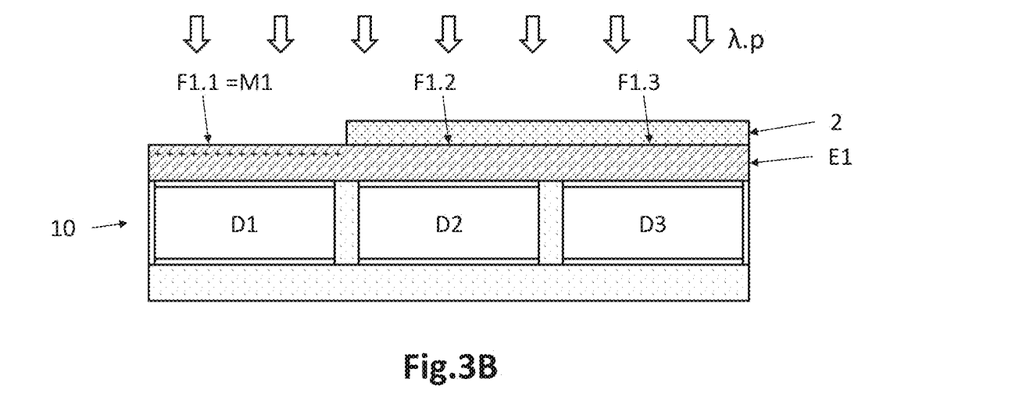
Figure 3C:
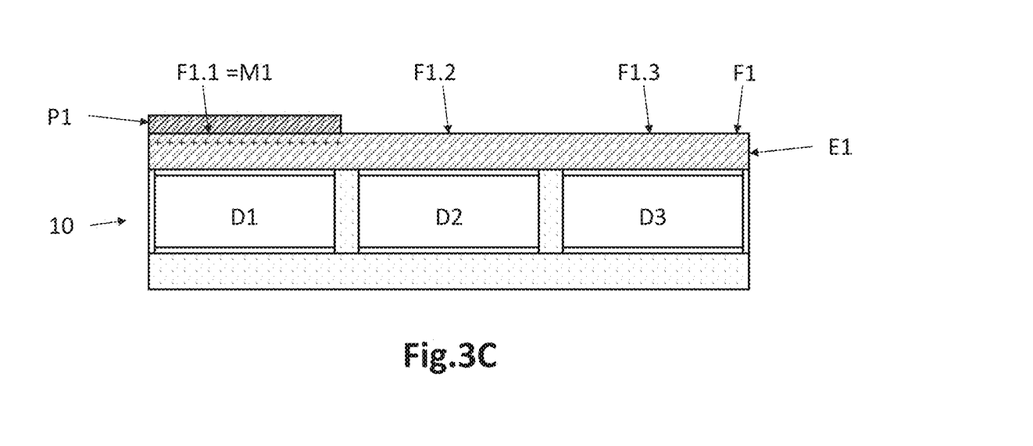

FIGS. 3A to 3C illustrate different steps of a method for manufacturing an optoelectronic device according to another variant.

This method differs from that one of FIGS. 1A-1H essentially in that the electret layer E1 is made of a photochromic dielectric material which is locally polarised, optically, to form the surface potential patterns, and not by depolarisation of an electret layer having an initially non-zero surface potential. In other words, the surface potential patterns are optically made by localised polarisation of an electret layer initially having a zero surface potential over its entire surface.

The photochromic material of the electret layer E1 is then adapted to absorb at least partially a predefined polarisation light radiation, for example between 100 nm and 380 nm, leading to an electrical polarisation of the layer. Finally, it is also at least partially transparent to the light radiation emitted by the diodes, for example in the blue band. The photochromic material may be composed of a matrix material such as poly(methyl methacrylate) (PMMA) or polystyrene (PS), containing from 1 to 20% by weight of a photochromic material which may be selected from among Spiropyrans (SP) or 1',3'-dihydrol, 3',3'trimethyl-6-nitrospiro[2H-1-benzopyran-2,2 112 0-(2H)-indole] or N,N'-ditridecylperylene-3,4,9,10-tetracarboxylic diimide (PTCDI-C13H27) or 1,2-bis-[2-methyl-5-(p-cyanophenyl)-3-thienyl]perfluorocyclopentene (DTE-CN). This last material is described in particular in the article by Castagna et al. entitled *Photochromic Electret: A New Tool for Light Energy Harvesting*, The Journal of Physical Chemistry Letters, 3 (1), 51-57, 2012.

Referring To FIG. 3A, an array of diodes 10 covered by an electret layer E1 is provided. The upper face F1 of the latter has, over is entire surface, a substantially zero surface potential. The electret layer E1 is then made of a photochromic material.

Referring to FIG. 3B, the surface potential patterns M1 are formed afterwards, by a localised polarisation of the electret layer E1 through an optical process. It is herein subjected, through an opaque mask 2 (a mask deposited over the electret layer, the photolithography mask, etc.) opposite the diodes D2 and D3, herein over the area F1.2 and F1.3 of the upper face F1, to a polarisation light radiation, with a predefined wavelength λ.p, which is absorbed by the electret layer E1 only in the area F1.1, and not in the areas F1.2 and F1.3. Thus, the surface potential is not defined in the areas F1.2 and F1.3 and remains zero, while it is non-zero in the area F1.1, which defines the surface potential patterns M1.

It should be noted that the localised polarisation of the electret layer E1 could, of course, be performed by selective activation of the diodes of the array 10.

Referring to FIG. 3C, the first photoluminescent pads P1 are made afterwards, in the same manner as before (cf. FIG. 2C), by contact of the electret layer E1 with a colloidal solution containing the photoluminescent particles p1. These are then deposited naturally over the electret layer E1 in the surface potential patterns M1, so that the photoluminescent pads P1 are positioned opposite the diodes D1 and not opposite the diodes D2 and D3.

The manufacturing method may be carried on in the same manner as before (not shown), except that it is not necessary to use a second electret layer E2. Thus, a second insolation of the electret layer E1 which has surface potential patterns M2 (located for example opposite the diodes D3) is carried out, and finally the photoluminescent pads P2 located opposite the surface potential patterns M2 are made. Once all of the photoluminescent pads have been deposited by dielectrophoresis, insolation with visible light of the entire electret layer E1 is advantageously performed in order to improve, where needed, the transparency of this layer in the visible range of the spectrum.

FIGS. 4A to 4F illustrate different steps of a method for manufacturing an optoelectronic device according to another variant.

This method differs from the method described in FIG. 1A et seq. essentially in that at least one amongst the electret layers, and herein the two electret layers E1, E2, is made of a dielectric material which is electrically polarised, electrostatically. For this purpose, we take advantage of the upper electrode layer 13. In other words, the surface potential patterns are optically made by localised depolarisation of an electret layer initially having, over its entire surface, a non-zero surface potential.

Figure 4A:
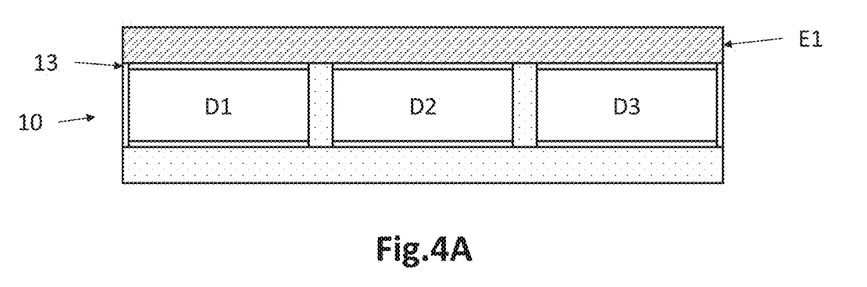
FIGS. 4A to 4F illustrate different steps of a variant of the method for manufacturing an optoelectronic device, where at least one of the electret layers is made of a dielectric material which is electrically polarised through an electrostatic process.

Referring to FIG. 4A, an array of diodes 10 covered with an electret layer E1 is provided. The upper face F1 of the latter has, over its entire surface, a substantially zero initial surface potential. The electret layer E1 is then made of an inorganic dielectric material such as, for example, a silicon oxide ($Si_xO_y$), a silicon nitride ($Si_xN_y$), an aluminium oxide ($Al_xO_y$), a titanium oxide ($Ti_xO_y$), a tantalum oxide ($Ta_xO_y$), a hafnium oxide ($Hf_xO_y$), and even an organic dielectric material (PMMA, etc.).

Figure 4B:
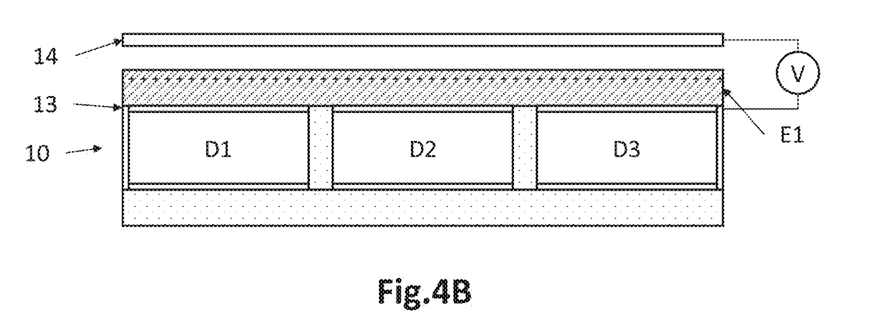

Referring to FIG. 4B, a non-zero surface potential is defined over the entire surface of the upper face of the electret layer E1. For this purpose, we take advantage of the upper electrode layer 13 which extends under the entire surface of the electret layer E1. An additional electrode 14 arranged over the entire electret layer E1 is also approached, and a potential difference is applied between these two electrodes 13, 14. A non-zero surface potential is then created over the entire surface of the upper face of the electret layer E1. Other techniques for charging the electret layer may be considered (plasma, ion implantation, corona discharge, etc.).

Figure 4C:
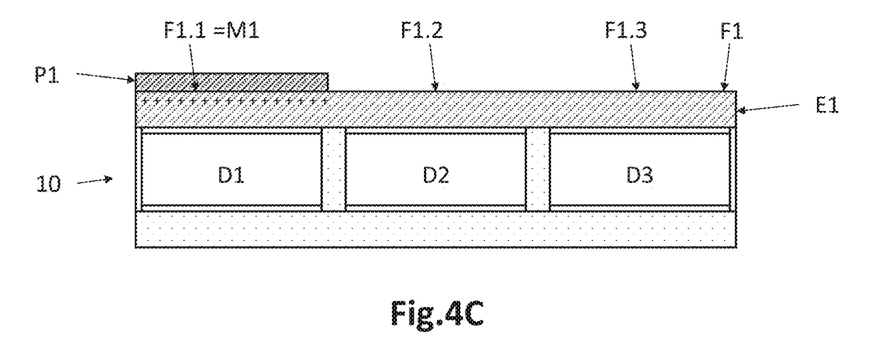

Referring to FIG. 4C, the surface potential patterns M1 are optically defined afterwards, by localised depolarisation of the electret layer E1, according to one of the previously-described manners. Then, the photoluminescent pads P1 are made, in the same manner as before (cf. FIG. 1C), by contact of the electret layer E1 with a colloidal solution containing the photoluminescent particles p1. These are then deposited naturally over the electret layer E1 in the surface potential patterns M1, so that the photoluminescent pads P1 are positioned opposite the diodes D1 and not opposite the diodes D2 and D3. The surface potential of the patterns M1 then becomes substantially zero.

Afterwards, a second electret layer E2 is made having surface potential patterns M2. In this case, the electret layer E2 is made like the electret layer E1 by electrostatic polarisation of a layer having a zero initial electrical potential. Alternatively, the second electret layer may be made like in the previously-described examples with reference to FIG. 1A-1H, to FIG. 2A-2C and to FIG. 3A-3C.

Figure 4D:
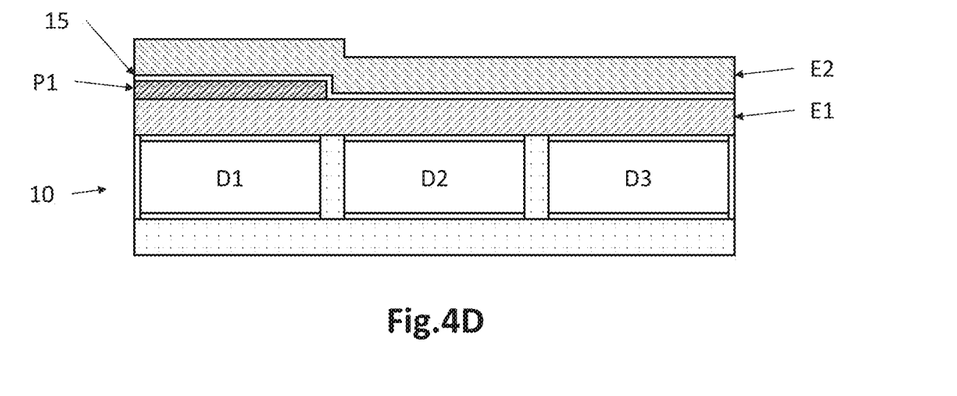
Figure 4E:
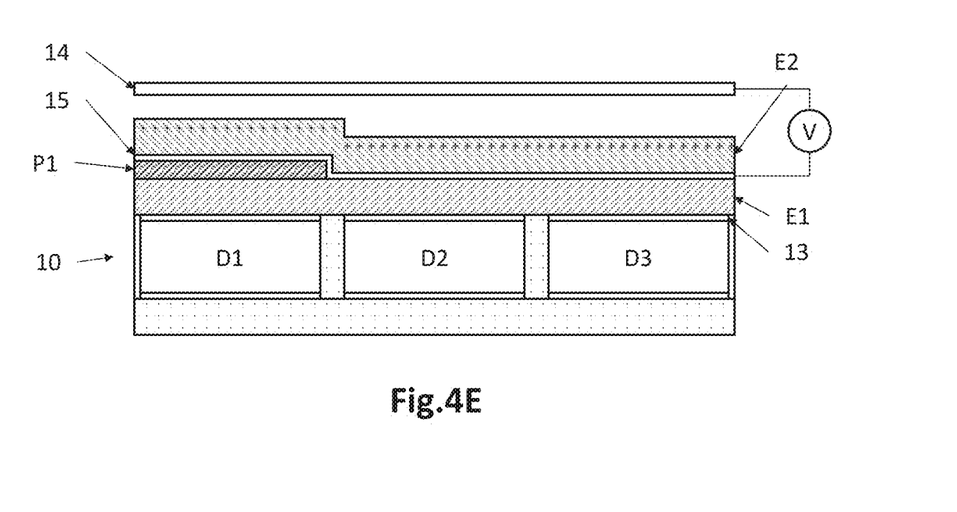

Referring to FIG. 4D, an electrode layer 15 is firstly made which covers the entire array of diodes 10, and herein more specifically the photoluminescent pads P1 and the electret layer E1. Then, an electret layer E2 is deposited. It entirely extends over the electrode layer 15 and herein also ensures the encapsulation of the photoluminescent particles of the pad P1. The upper face of the electret layer E2 has, over its entire surface, a substantially zero initial surface potential. The electret layer E2 may be made of a dielectric material identical to that one of the electret layer E1. Referring to FIG. 4E, a non-zero surface potential is defined over the entire surface of the upper face of the electret layer E2. For this purpose, a potential difference is applied between the electrode layer 15 and an additional electrode 14 arranged above the entire electret layer E2. A non-zero surface potential is then created over the entire surface of the upper face of the electret layer E2. It should be noted that the electrode layer 15 could be not used: a potential difference would then be applied between the electrode 14 and the electrode 13.

Figure 4F:
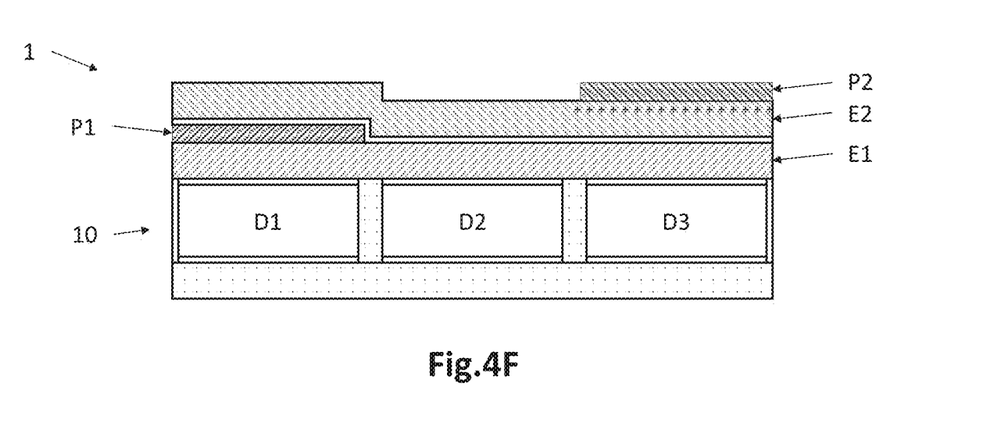

Referring to FIG. 4F, the surface potential patterns M2 are defined afterwards, by localised depolarisation of the electret layer E2 through an optical process. Then, the photoluminescent pads P2 are made afterwards in the same manner as before (cf. FIG. 1G), by contact of the electret layer E2 with a colloidal solution containing the photoluminescent particles p2. These are then naturally deposited over the electret layer E2 in the surface potential patterns M2, so that the photoluminescent pads P2 are positioned opposite the diodes D2 and not opposite the diodes D1 and D2. The surface potential of the patterns M2 then becomes substantially zero.

Particular embodiments have just been described. Various variants and modifications will become apparent to a person skilled in the art.

The invention claimed is:

1. A method for manufacturing an optoelectronic device including an array of diodes configured to emit or receive a light radiation, and a color conversion structure, covering at least partially the array of diodes, and containing photoluminescent pads arranged opposite at least one diode, the method comprising:
   providing the array of diodes;
   making an electret layer covering the array of diodes, and an upper face of which, opposite to the array of diodes, has predefined surface potential patterns where the surface potential is non-zero; and
   making the photoluminescent pads, by contact of the electret layer with a colloidal solution containing photoluminescent particles, which are then deposited over the upper face of the electret layer opposite the predefined surface potential patterns, thereby forming the photoluminescent pads, wherein the step of making the electret layer includes:
(B1) making an electret layer whose upper face has, over its entire face, a non-zero or zero initial surface potential;
(B2a) in the case where the initial surface potential is non-zero:
illuminate areas of the electret layer with a depolarization light radiation which can be absorbed at least partially by the electret layer, said illuminated areas being distinct from non-illuminated areas intended to form the surface potential patterns, the absorption of the depolarization light radiation in the illuminated areas causing a cancellation of the local surface potential, the non-illuminated areas then defining the surface potential patterns; and
(B2b) in the case where the initial surface potential is zero: illuminate areas of the electret layer by a polarization light radiation which can be absorbed at least partially by the electret layer, the absorption of the polarization light radiation in the illuminated areas causing a formation of a non-zero local surface potential, the illuminated areas then defining the surface potential patterns.

2. The manufacturing method according to claim 1, further comprising:
prior to the step B2a or the step B2b, arranging an opaque mask, made of a material opaque to the depolarization or polarization light radiation, extending only over the areas of the electret layer to form the surface potential patterns; and
during the step B2a or the step B2b, the depolarization or polarization light radiation is emitted in the direction of the opaque mask and the electret layer, and is absorbed by the electret layer in the areas not covered by the opaque mask.

3. The manufacturing method according to claim 1, wherein:
the diodes are light-emitting diodes;
the electret layer is made of a material configured to partially absorb the light radiation emitted by the light-emitting diodes, which causes a cancellation of the local surface potential; and
during the step B2a, some diodes are selectively activated so as to illuminate the electret layer in the areas intended not to form the surface potential patterns, which causes a cancellation of the local surface potential, the non-illuminated areas then defining the surface potential patterns; or, during the step B2b, diodes are selectively activated so as to illuminate the electret layer only in the areas intended to form the surface potential patterns.

4. The manufacturing method according to claim 1, wherein, in the step B2a, the electret layer is made of a self-polarize organic dielectric material, so that the step B1 includes depositing the electret layer covering the array of diodes, the electret layer then having, over an entire surface thereof, a non-zero initial surface potential.

5. The manufacturing method according to claim 1, wherein, in the step B2b, the electret layer is made of a photochromic dielectric material, so that the step B1 includes depositing an electret layer, made of the photochromic dielectric material, covering the array of diodes, the electret layer then having, over an entire surface thereof, a zero surface potential.

6. The manufacturing method according to claim 1, wherein, in step B2a, the electret layer is made of a dielectric material, so that the step B1 further comprises:
depositing an electret later, made of the dielectric material, covering the array of diodes, the electret layer then having, over an entire surface thereof, a zero initial surface potential; and
subjecting the electret layer to a predefined polarization electric field, causing a formation of a non-zero surface potential over the entire surface of the electret layer.

7. The manufacturing method according to claim 6, wherein:
the array of diodes includes an upper electrode layer covering the diodes and configured to electrically polarize the diodes, and
during the step of subjecting the electret layer to the polarization electric field, the electret layer is arranged between the upper electrode layer and an added-on electrode, between which a predefined potential difference is applied.

8. The manufacturing method according to claim 1, wherein:
the electret layer is a first electret layer, and the photoluminescent pads are first photoluminescent pads configured to convert an incident light radiation with a first wavelength into a light radiation with a second wavelength different from the first wavelength;
the method further comprises, after the step of making the photoluminescent pads:
making a second electret layer, covering the array of diodes and the first electret layer, and an upper face of which, opposite to the array of diodes, has second predefined surface potential patterns where the surface potential is non-zero, said second surface potential patterns being located opposite diodes distinct from those opposite which the first surface potential patterns are located; and
making the second photoluminescent pads, by contact of the second electret layer with a colloidal solution containing second photoluminescent particles, different from the first photoluminescent particles, which are then deposited over the upper face of the second electret layer opposite the second predefined surface potential patterns, thereby forming the second photoluminescent pads.

9. The manufacturing method according to claim 8, wherein the diodes of the array are light-emitting diodes configured to emit a light radiation at the same wavelength, and form with the first and second photoluminescent pads, an array of red, green, blue luminous pixels.

10. The manufacturing method according to claim 1, wherein the array of diodes has a dimension, in a plane parallel to the array of diodes, larger than or equal to 100 mm.

11. The manufacturing method according to claim 1, wherein the array of diodes has a pitch with a periodicity smaller than or equal to 10 µm.

* * * * *

UNITED STATES PATENT AND TRADEMARK OFFICE
CERTIFICATE OF CORRECTION

PATENT NO. : 12,278,315 B2  
APPLICATION NO. : 18/799155  
DATED : April 15, 2025  
INVENTOR(S) : Stephane Altazin et al.

Page 1 of 1

It is certified that error appears in the above-identified patent and that said Letters Patent is hereby corrected as shown below:

On the Title Page

Item (30) should read:  
--(30) Foreign Application Priority Data  
Aug. 10, 2023 (FR).................... 2308637--

Signed and Sealed this  
First Day of July, 2025

Coke Morgan Stewart  
*Acting Director of the United States Patent and Trademark Office*